United States Patent [19]
Lee

[11] Patent Number: 5,978,050
[45] Date of Patent: *Nov. 2, 1999

[54] CONTROLLING METHOD FOR A MULTISYSTEM BY A MODE-CONVERSION KEY

[75] Inventor: Sang-Su Lee, Suwon, Rep. of Korea

[73] Assignee: SamSung Electronics Co., Ltd., Suwon, Rep. of Korea

[ * ] Notice: This patent is subject to a terminal disclaimer.

[21] Appl. No.: 08/635,218

[22] Filed: Apr. 15, 1996

Related U.S. Application Data

[63] Continuation of application No. 07/701,824, May 17, 1991, Pat. No. 5,508,762.

[30] Foreign Application Priority Data

May 23, 1990 [KR] Rep. of Korea .......................... 90-7569

[51] Int. Cl.$^6$ .................................................. H04N 1/44
[52] U.S. Cl. .......................... 348/731; 348/732; 348/734; 348/570
[58] Field of Search ...................................... 348/569, 570, 348/731, 732, 734; 455/151.1, 159.1, 180.1, 181.1; 386/83; H04N 5/50

[56] References Cited

U.S. PATENT DOCUMENTS

| | | | |
|---|---|---|---|
| 5,103,314 | 4/1992 | Keenan | 348/732 |
| 5,161,023 | 11/1992 | Keenan | 348/732 |
| 5,182,646 | 1/1993 | Keenan | 348/732 |
| 5,508,762 | 4/1996 | Lee | 348/734 |
| 5,532,832 | 7/1996 | Hailey et al. | 348/732 |

*Primary Examiner*—Michael Lee
*Attorney, Agent, or Firm*—Robert E. Bushnell, Esq.

[57] ABSTRACT

The present invention relates to televisions (TV) and video tape recorders (VTR) which carry out the tuning operation by using a microcomputer. The microcomputer converts the modes in sequence of conventional air mode, cable TV Standard mode, cable TV Harmonic Relate Carrier mode, and multibroadcasting mode according to the inputted signal from a key matrix to control both the conventional and multibroadcasting modes which have different channels frequencies. Thus, independant systems or additional programs for multimode systems are not necessary.

16 Claims, 3 Drawing Sheets

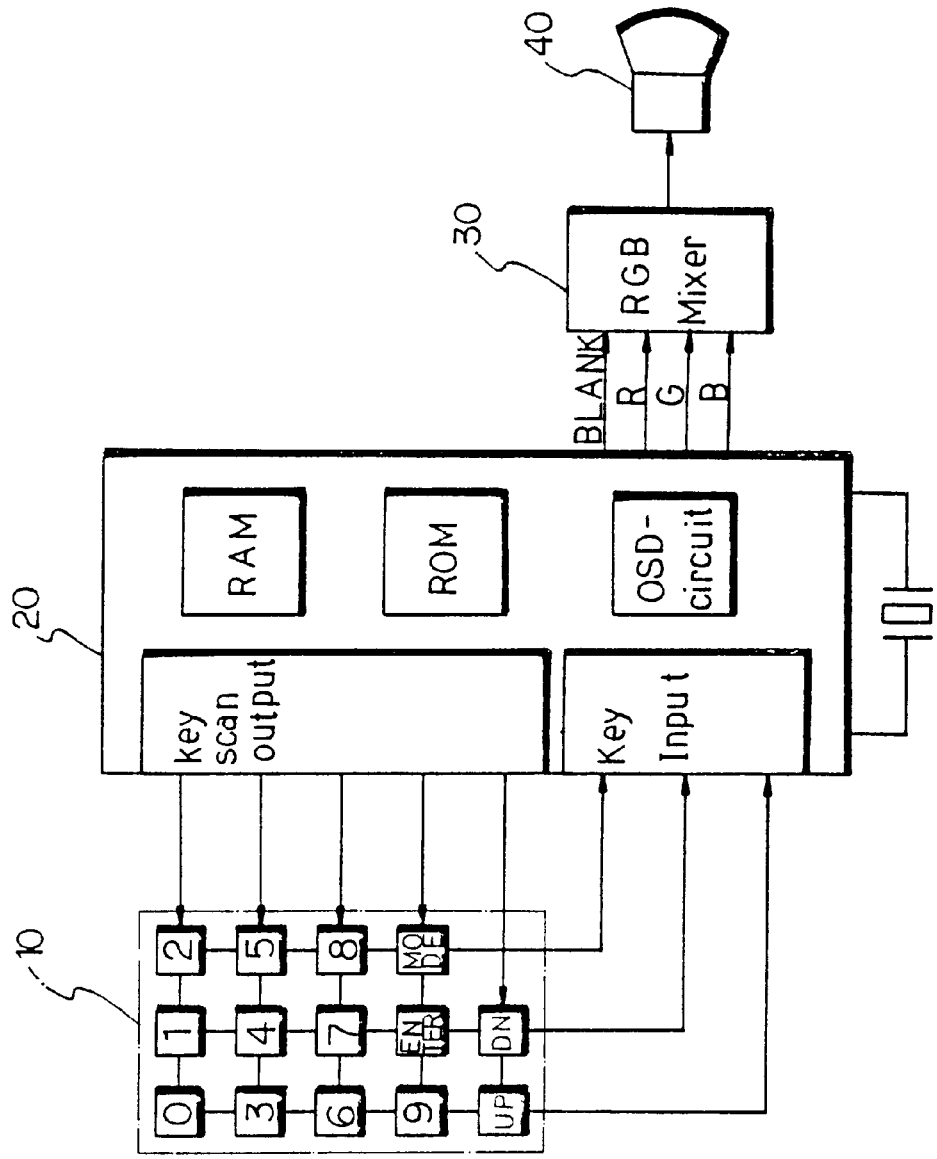

CONTROLLING METHOD FOR A MULTISYSTEM BY A MODE-CONVERSION KEY

CROSS REFERENCE TO RELATED APPLICATIONS

This application is a continuation of U.S. Patent Application Ser. No. 07/701,824, filed in the U.S. Patent & Trademark Office on May 17, 1991, now U.S. Pat. No. 5,508,762.

BACKGROUND OF THE INVENTION

The present invention relates to televisions (TV's) and video tape recorders (VTR's) and more particularly to a controlling method for a multisystem that controls two broadcasting ways by manipulation of a mode-conversion key in a broadcasting system such as NTSC or PAL which is tuned by a microcomputer (MICOM).

Generally, in the systems which are tuned by MICOM, if the broadcasting ways or the frequencys used is different from each other, it is impossible to control several broadcasting ways by one controlling system.

Therefore, independent system should be set up respectively, or a program of MICOM should be newly designed for the realization of the multisystem.

SUMMARY OF THE INVENTION

The presernt invention meets above-said problem by providing a controlling method for a sultisystem by a mode-conversion key that controls two broadcasting ways in a system having different channel frequencies. The present invention is a method for controlling a television signal tuner, said method comprising: a first routine for selecting between a plurality of broadcasting modes in response to a mode-conversion signal, said plurality of broadcasting modes comprising a multibroadcasting mode, and a second routine for tuning a current channel in response to channel selection, said second routine comprising: in response to operation of a channel-up key, incrementing the current channel unless the current channel is the highest channel, and when the current channel is the highest channel, selecting the lowest channel as the current channel; in response to operation of a channel-down key, decrementing the current channel unless the current channel is the lowest channel, and when the current channel is the lowest channel, selecting the highest channel as the current channel; and after decrementing or incrementing, tuning in response to the current channel; said second routine further comprising the following steps when the selected broadcasting mode is said multibroadcasting mode: when the current channel is a lowest channel of a higher-range of channels, selecting a highest channel of a lower-range of channels as the current channel in response to a channel-down key signal, and when the current channel is a highest channel in the lower-range, selecting a lowest channel in the higher-range as the current channel in response to a channel-up key signal.

BRIEF DESCRIPTION OF THE DRAWINGS

These and other objects, features, and advantages of the present invention will become more apparent from the following description for the preferred embodiments taken in conjunction with the accompanying drawings, in which:

FIG. 1 shows a block diagram of the system for performing a control method by using a mode-conversion key accor ding to the present invention.

DETAILED DESCRIPTION OF THE INVENTION

The present invention will now be described in more detail with reference to the accompanying drawings.

FIG. 1 shows a block diagram of the system for carrying out a control method by using a mode-conversion key according to the present invention.

A key matrix 10 is connected to a MICOM 20 and thus the key input signal is transferred to the MICOM 20. A 8-bit or 4-bit counter is fitted in the MICOM 20. Also, a RGB mixer 30 is connected to the MICON 30 in order to display the broadcasting signal corresponding to the selected broadcasting way on the cathud ray tube (CRT) 40.

Figure 2A:
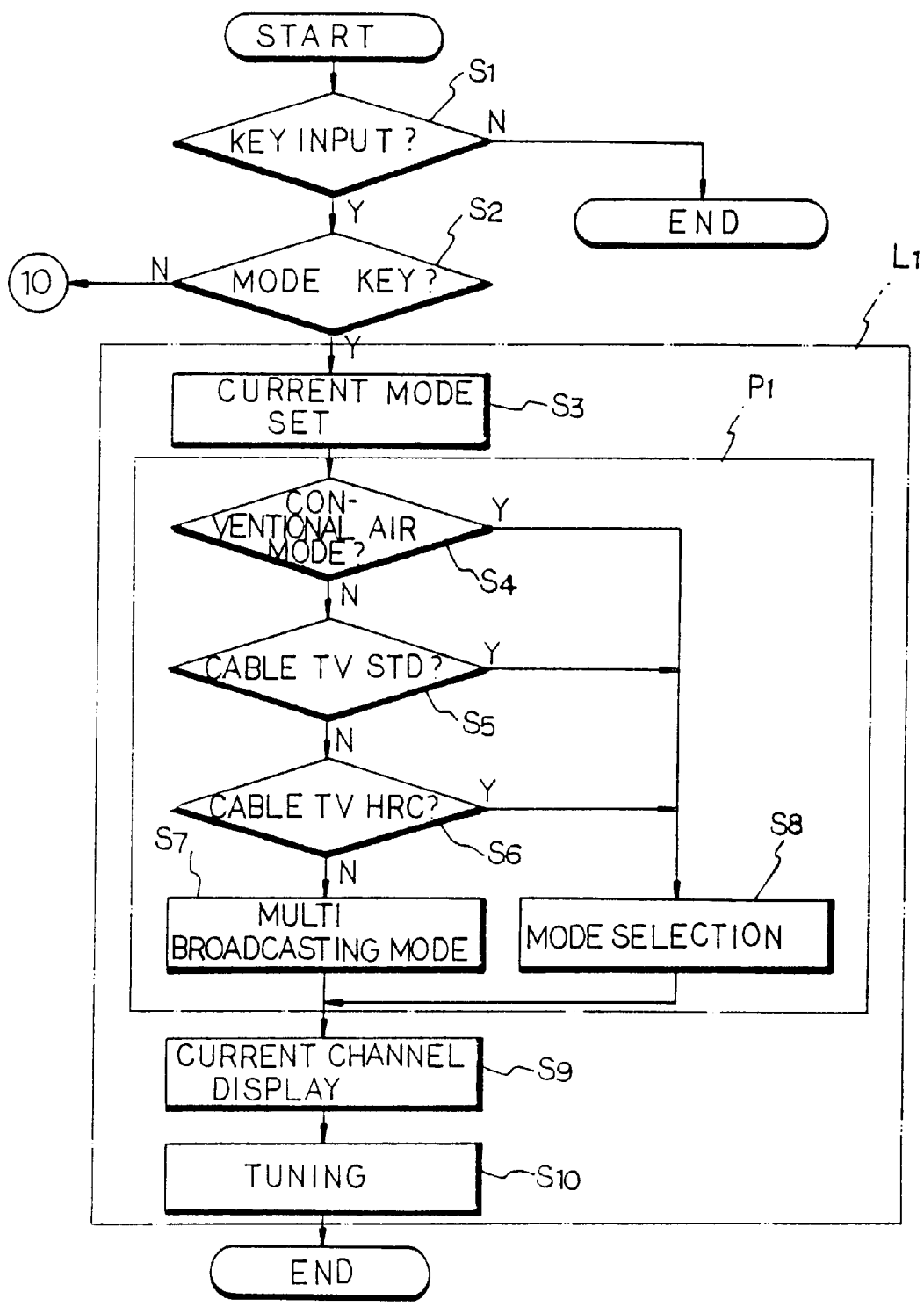
FIGS. 2(A) and 2(B) show a flowchart of a control method by using a mode-coniversion key according to the present invention.
Figure 2:
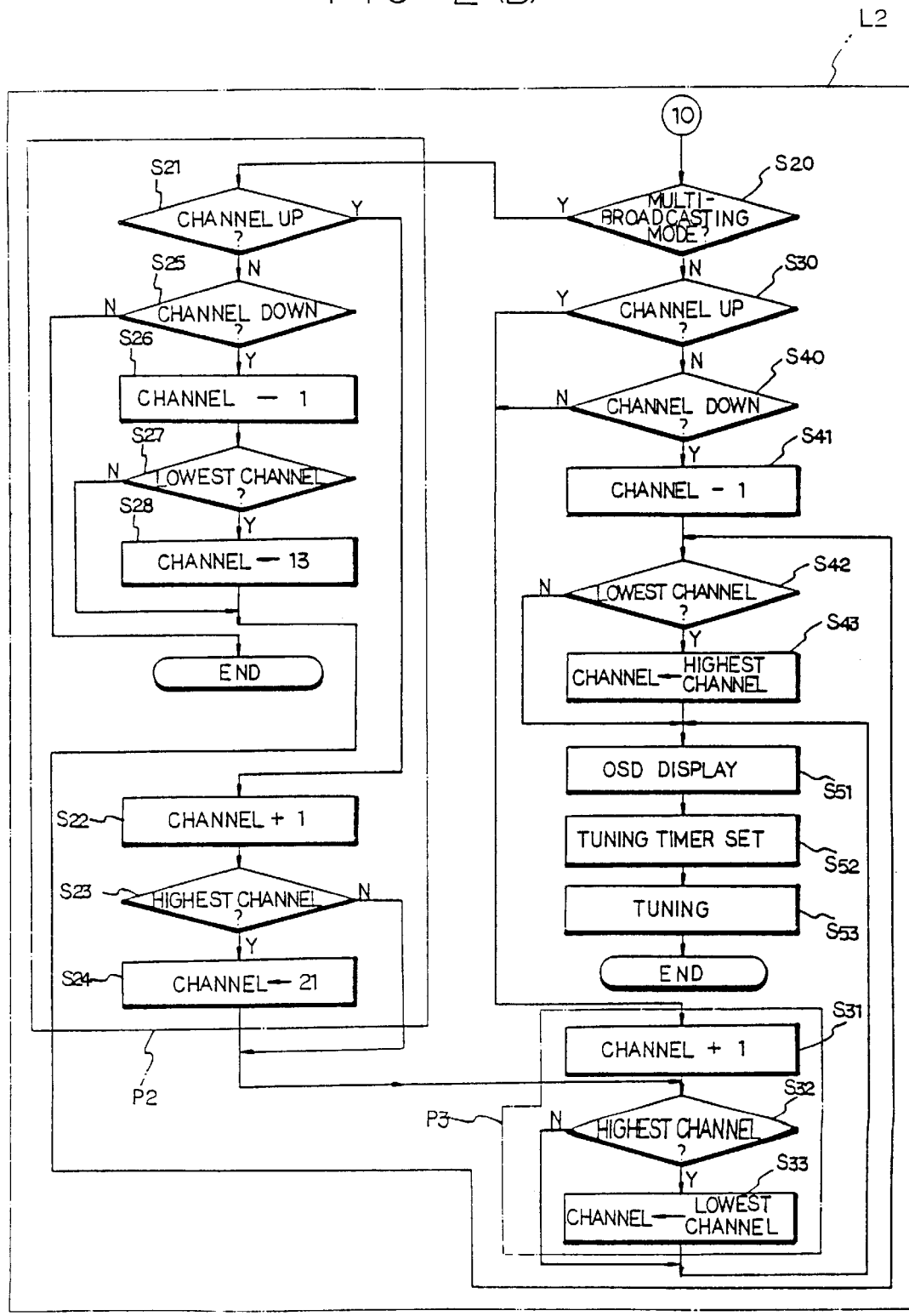

FIGS. 2(A) and 2(B) show a flowchart of a method for controlling the multisystem by using a mode-conversion key.

The flowchart is composed of a first routine LI for selecting the corresponding broadcasting way if the input key is proven to be a mode-conversion one, displaying and tuning the selected broadcasting way and a second routine L2 for tuning a corresponding channel if the input key is proven not to be a mode-conversion key.

In the first routine LI, a first process P1 that converts sequentially the broadcasting modes after setting the current selected mode in a step S3 when the power is turned off by the mode-conversion key, is carried out. After the first process P1, a step S9 for displaying the selected broadcasting mode and a step S10 for tuning the selected miode is subsequently carried out. In the second routine L2, on the other hand, a second process P2 that selects the opposite channel distinguishing the lowest or highest channel from each other corresponding to the selected broadcasting way mode when a channel-up or down key signal is entered in the case of a multi-broadcasting mode and a third process P3 that increases the channel and selects the lowest channel if the increased channel is the highest channel when the channel-up key signal is entered in the case of not multi-broadcasting-mode or not mode-conversion, are carried out. Similarly, if the input key is the channel-down signal, a fourth process P4 that decreases the channel and selects the highest chanmel if the decreased channel is the lowest channel is carried out. After the third and fourth processes P3 and P4, the fifth process P5 that tunes the corresponding channel is carried out.

Now the effect of the present invention is described. First, the MICOM 20 checks the input signal from the key matrix 10 in a step S1 and checks whether the input signal is the mode-conversion key signal in a step S2. In case of the mode-conversion, the mode is converted after the current mode is set in a step S3. The current mode corresponds to a mode that is selected when the power is turned off. Thus if the current mode is either conventional air mode or cable TV mode, the mode is converted, while if the current mode is neither the air mode nor the cable TV mode, the multibroadcastiiig mode is set in steps S4~S8.

The sequence of mode conversion is as follows: the conventional air mode→the cable TV STD(Standard) mode→the cable TV HRC (Harmonic Relate Carrier) mode→multibroadcasting mode. That is, if the mode-conversion signal is entered from the key matrix K, the node is converted one by one after the current mode is set. In other words, the multibroadcasting mode is added instead of the conventional cable TV IRC (Incremental Relate Carrier) mode.

Then, after the mode is selected by the mode-conversion key input signal, the selected current channel is displayed aid twied to carry out the selected mode in steps S9 and S10, where At above, the display of the current channel does not mean the display on the screen but the internal recognition of the MICOM 20.

If the other key signal, not the mode-conversion key signal, is entered the mode is checked to be either the multibroadcasting mode or not in a step S20, aid then, in case of the multibroadcasting mode, the channels 14~20 must be skipped by the channel up/down keys. That is, the various broadcasting ways are allowable in the multibroadcasting mode, but, in the present invention, the German broadcasting way is taken as an example.

In the German broadcasting way, the channels 2~13 correspond to VHF channel mode aid the channels 21~69 correspond to UHF channel mode, and thus, the channels 14~20 are skipped. Thus, if the channel-up key signal enters in the multibroadcasting mode, the one-increased channel is checked for whether it is the highest channel 13 of the German VHF broadcasting way or not in steps S22 and S23.

Similarly, if the channel-down key signal enters, one-decreased channel is checked for whetler it is the lowest channel 21 of the German UHF broadcasting way or not in steps S25 and S26. Then, if the one increased channel is not the channel 13, the channel is again increased.

By repeating this, when the channel neels the channel 13, the current channel is converted to the channel 21 which is the lowest channel for the UHF broadcasting way, in a step 24 and again, the channel is checked to be the highest channel in a step S32. On the other hand, if the one-decreased channel is not the channel 21, the channel is again decreased.

By repeating this, if the chanmel meets the channel 21, the current channel is converted to to be chanmel 13 which is the highest channel for the VHF broadcasting way in a step S28 and the channel is checked again for whether it is the lowest chaannel or not, in a step 342. Thus, if the increased or decreased channel is not the channel 69 or 2, respectively, the increased or decreased channel is displayed in a step S51 and the tuning time is set to the 8-bit or 4-bit counter in the MICOM 20, displaying the time on screen, and tuning the channel is carried out in steps S52 and S53. In korean case, the tuniUg time is 3 seconds.

To the contrary, if the increased channel is the highest channel 69, the channel is converted to the lowest channel 2 in a step S33 and the tuning process is repeated in steps S51~S53, while if the decreased channel is the lowest channel 2, thc channel 2 is converted to the highest channel 69 in a step 543 and the twuling process is carried out in the step S51~53. Thus, in the multibroadcasting mode, the channel, 2~13 and 21~69 are sequentially selected while skipping the unavailable channels 14~20.

On the other hand, it the inputted key signal is not one of the mode conversion key signal and the multibroadcasting mode key signal but the channel-down key signal, the channel is one-decreased and is checked for whether it s the lowest channel or not, in a step S42. In korean case, the lowest channel is the channel 2 for the air mode, and the channel 1 for the cable TV STD mode, while in U.S.A. the lowest channel for the air mode is the channel 3. After the step S42, if the decreased channel is nioL tie lowest channel, the channel is displayed oin screen in a step S51 and the tuning of the channel is carried out by setting the 3-second timer iin steps S52 and S53.

On the other hand, if the decreased channel is the lowest channel, the channel is converted to the highest channel and subsequently the tuning of the channel is carried out in steps S51~S53. The highest channel for the conventional air mode is the channel 83 in korea and the channel 69 in U.S.A.

Similarly, if the inputted key signal is the channel-up key signal, the channel is one-increased iii a step S30 aid subsequently is compared with the highest clainmel in steps S31 and S32. So, if the increased channel is not the higihest channel, the tunilig steps S51~S53 are carried out, while if the increased channel is the highest one, the channel is converted to the lowest one in a step S33 and subsequently the same tuning steps S51~S53 are carried out.

As described up to now, the present invention can control the mode in a sequenlce of air mode, cable TV STD mode, cable TV HRC mode and multibroadcasting mode by the mode-conversion key. The newly added multibroadcasting mode has a different channel frequency and thus its broadcasting way is different from tie conventional one. But, all the modes can be controlled by the mode-conversion key in a single broadcasting system. Thus, indepedent systems for multibroadcastilig way are not required and an additional program is not necessary since the present invention controls two broadcasting ways by a single mode-conversion key.

The invention is in no way limited to the embodiment described hereinabove. Various modifications of disclosed embodiment as well as other emibodiments of tile invention wil become apparent to persons skilled in the art upon reference to tile description of the invention. It is therefore contemplated that the appended claims will cover any such modifications or embodiments as fall with in the true scope of the invention .

What is claimed is:

1. A method for controlling a television signal tuner, said method comprising:

a first routine for selecting between a plurality of broadcasting modes in response to a mode-conversion signal, said plurality of broadcasting modes comprising a multibroadcasting mode; and a second routine for tuning a current channel in response to a channel selection, said second routine farther comprising the following steps when the selected broadcasting mode is said multibroadcasting mode:

when the current channel is a lowest channel of a higher-range of channels, selecting a highest channel of a lower-range of channels as the current channel in response to a channel-down key signal; and when the current channel is a highest channel in the lower-range, selecting a lowest channel in the higher-range as the current channel in response to a channel-up key signal.

2. The method according to claim 1, wherein said first routine comprises:

setting a current mode to a most recent mode;

successively converting the current mode to a different one of said plurality of broadcasting modes in response to the mode conversion signal; and displaying the current mode, and tuning the television signal tuner in response to the current mode.

3. The method according to claim 1, wherein said tuning comprises:

displaying the current channel on a screen;

tuning the current channel by setting a tuning time for a counter in a microcomputer; and converting to the current channel.

4. The method according to claim 1, wherein said plurality of broadcasting modes further comprise at least one of a conventional air mode, a cable television standard mode, and a cable television harmonic related carrier mode.

5. The method according to claim 2, wherein said tuning comprises:
   displaying the current channel on a screen;
   adjusting the current channel by setting a tuning time for a counter in a microcomputer; and
   converting to the current channel.

6. The method according to claim 2, wherein said plurality of broadcasting modes further comprises at least one of a conventional air mode, a cable television standard mode, and a cable television harmonic related carrier mode.

7. A method for controlling a television signal tuner, said method comprising:
   a first routine for selecting between a plurality of broadcasting modes in response to a mode-conversion signal, said plurality of broadcasting modes comprising a multibroadcasting mode, and
   a second routine for tuning a current channel in response to channel selection;
   wherein said first routine comprises setting a current mode to a most recent mode, then successively converting the current mode to a different one of said plurality of broadcasting modes in response to said mode conversion signal, displaying the current mode, and tuning in response to the current mode; and
   wherein said second routine comprises:
      in response to operation of a channel-up key, incrementing the current channel unless the current channel is the highest channel, if the current channel is the highest channel selecting the lowest channel as the current channel;
      in response to operation of a channel-down key, decrementing the current channel unless the current channel is the lowest channel, if the current channel is the lowest channel selecting the highest channel as the current channel; and
      after decrementing or incrementing, tuning in response to the current channel.

8. The method according to claim 7, wherein said second routine further comprises the following steps if the selected broadcasting mode is said multibroadcasting mode:
   if the current channel is a lowest channel of a higher-range of channels, selecting a highest channel of a lower-range of channels as the current channel in response to a channel-down key signal; and
   if the current channel is a highest channel in the lower-range, selecting a lowest channel in the higher-range as the current channel in response to a channel-up key signal.

9. The method according to claim 8, wherein said tuning comprises:
   displaying the current channel on a screen;
   tuning the current channel by setting a tuning time for a counter in a microcomputer and displaying the tuning time; and
   converting to the current channel.

10. The method according to claim 9, wherein said plurality of broadcasting modes further comprises at least one of a conventional air mode, a cable television standard mode, and a cable television hannonic related carrier mode.

11. A method for controlling a television signal tuner, said method comprising:
   a first routine for selecting between a plurality of broadcasting modes in response to a mode-conversion signal, said plurality of broadcasting modes comprising a multibroadcasting mode;
   a second routine for tuning a current channel in response to channel selection;
   wherein said second routine comprises:
      in response to operation of a channel-up key, incrementing the current channel unless the current channel is the highest channel, if the current channel is the highest channel selecting the lowest channel as the current channel;
      in response to operation of a channel-down key, decrementing the current channel unless the current channel is the lowest channel, if the current channel is the [lwoest] lowest channel selecting the highest channel as the current channel; and
      after decrementing or incrementing, tuning in response to the current channel;
   wherein said second routine firther comprises the following steps if the selected broadcasting mode is said multibroadcasting mode:
      if the current channel is a lowest channel of a higher-range of channels, selecting a highest channel of a lower-range of channels as the current channel in response to a channeldown key signal; and
      if the current channel is a highest channel in the lower-range, selecting a lowest channel in the higher-range as the current channel in response to a channel-up key signal; and
   wherein said tuning comprises:
      displaying the current channel on a screen;
      tuning the current channel by setting a tuning time for a counter in a microcomputer and displaying the tuning time; and
      converting to the current channel.

12. The method according to claim 11, wherein said plurality of broadcasting modes further comprises at least one of a conventional air mode, a cable television standard mode, and a cable television hannonic related carrier mode.

13. A method for controlling a television signal tuner, said method comprising:
   a first routine for selecting between a plurality of broadcasting modes in response to a modeconversion signal, said plurality of broadcasting modes comprising a multibroadcasting mode, and
   a second routine for tuning a current channel in response to channel selection;
   wherein said first routine comprises setting a current mode to a most recent mode, then successively converting the current mode to a different one of said plurality of broadcasting modes in response to said mode conversion signal, displaying the current mode, and tuning in response to the current mode; and
   wherein said plurality of broadcasting modes further comprises at least one of a conventional air mode, a cable television standard mode, and a cable television harmonic related carrier mode.

14. The method according to claim 13, wherein said tuning comprises:
   displaying the current channel on a screen;
   tuning the current channel by setting a tuning time for a counter in a microcomputer and displaying the tuning time; and
   converting to the current channel.

15. A method for controlling a television signal tuner, said method comprising:
   a first routine for selecting between a plurality of broadcasting modes in response to a modeconversion signal, said plurality of broadcasting modes comprising a multibroadcasting mode, and a second routine for tuning a current channel in response to channel selection;

wherein said second routine comprises:
- in response to operation of a channel-up key, incrementing the current channel unless the current channel is the highest channel, if the current channel is the highest channel selecting the lowest channel as the current channel;
- in response to operation of a channel-down key, decrementing the current channel unless the current channel is the lowest channel, if the current channel is the lowest channel selecting the highest channel as the current channel; and
- after decrementing tr incrementing, tuning in response to the current channel; and wherein said plurality of broadcasting modes further comprises at least one of conventional air mode, a cable television standard mode, and a cable television harmonic related carrier mode.

16. The method according to claim 15, wherein said second routine further comprises the following steps if the selected broadcasting mode is said multibroadcasting mode:
- if the current channel is a lowest channel of a higher-range of channels, selecting a highest channel of a lower-range of channels as the current channel in response to a channel-down key signal; and
- if the current channel is a highest channel in the lower-range, selecting a lowest channel in the higher-range as the current channel in response to a channel-up key signal.

\* \* \* \* \*